(12) United States Patent
Yao et al.

(10) Patent No.: US 8,329,482 B2
(45) Date of Patent: Dec. 11, 2012

(54) WHITE-EMITTING LED CHIPS AND METHOD FOR MAKING SAME

(75) Inventors: Zhimin Jamie Yao, Goleta, CA (US); James Ibbetson, Santa Barbara, CA (US)

(73) Assignee: Cree, Inc., Goleta, CA (US)

( * ) Notice: Subject to any disclaimer, the term of this patent is extended or adjusted under 35 U.S.C. 154(b) by 185 days.

(21) Appl. No.: 12/771,938

(22) Filed: Apr. 30, 2010

(65) Prior Publication Data
US 2011/0266560 A1 Nov. 3, 2011

(51) Int. Cl.
*H01L 21/00* (2006.01)
(52) U.S. Cl. ............ 438/28; 257/88; 257/E33.056; 257/E33.001
(58) Field of Classification Search ............ 438/88, 438/28; 257/E33.056, E33.001, 88, E21.054, 257/E21.085
See application file for complete search history.

(56) References Cited

U.S. PATENT DOCUMENTS

| | | | |
|---|---|---|---|
| 4,346,275 A | 8/1982 | Iwakiri et al. | 200/314 |
| 4,476,620 A | 10/1984 | Ohki et al. | 438/33 |
| 4,865,685 A | 9/1989 | Palmour | 156/643 |
| 4,902,356 A | 2/1990 | Noguchi et al. | 148/33.4 |
| 4,912,532 A | 3/1990 | Cook et al. | 357/16 |
| 4,946,547 A | 8/1990 | Palmour et al. | 156/643 |
| 4,981,551 A | 1/1991 | Palmour | 156/643 |
| 5,087,949 A | 2/1992 | Haitz et al. | 357/17 |
| 5,103,271 A | 4/1992 | Izumiya et al. | 357/17 |
| 5,200,022 A | 4/1993 | Kong et al. | 156/612 |
| 5,376,241 A | 12/1994 | Shor et al. | 204/129.3 |
| 5,376,580 A | 12/1994 | Kish et al. | 437/127 |
| RE34,861 E | 2/1995 | Davis et al. | 437/100 |
| 5,502,316 A | 3/1996 | Kish et al. | 257/94 |
| 5,614,734 A | 3/1997 | Guido | 257/94 |

(Continued)

FOREIGN PATENT DOCUMENTS

EP 06 84 64 8 11/1995

(Continued)

OTHER PUBLICATIONS

Official Notice of Rejection for Japanese Patent Application No. 2006-513442 dated Jun. 8, 2010.

(Continued)

*Primary Examiner* — Caridad Everhart
(74) *Attorney, Agent, or Firm* — Koppel, Patrick, Heybl & Philpott

(57) ABSTRACT

Methods and devices for light emitting diode (LED) chips are provided. In one embodiment of a method, a pre-formed capping wafer is provided, with the capping wafer comprising a conversion material. A wire-bond free LED wafer is fabricated comprising a plurality of LEDs. The capping wafer is bonded to the LED wafer using an adhesive. The LED chips are later singulated upon completion of all final fabrication steps. The capping wafer provides a robust mechanical support for the LED chips during fabrication, which improves the strength of the chips during fabrication. Additionally, the capping wafer may comprise an integrated conversion material, which simplifies the fabrication process. In one possible embodiment for an LED chip wafer, a submount wafer is provided, along with a plurality of LEDs flip-chip mounted on the submount wafer. Additionally, a capping wafer is bonded to the LEDs using an adhesive, and the capping wafer comprises a conversion material. At least some of the light emitted from the LEDs passes through the capping wafer where at least some of the light is converted by the conversion material.

45 Claims, 5 Drawing Sheets

U.S. PATENT DOCUMENTS

| | | | |
|---|---|---|---|
| 5,644,156 A | 7/1997 | Suzuki et al. | 257/485 |
| 5,803,579 A | 9/1998 | Turnbull et al. | |
| 5,939,732 A | 8/1999 | Kurtz et al. | 257/77 |
| 5,959,316 A | 9/1999 | Lowery | 257/98 |
| 5,985,687 A | 11/1999 | Bowers et al. | 438/46 |
| 6,071,795 A | 6/2000 | Cheung et al. | 438/458 |
| 6,132,072 A | 10/2000 | Turnbull et al. | |
| 6,212,213 B1 | 4/2001 | Weber et al. | |
| 6,225,647 B1 | 5/2001 | Kurtz et al. | 257/94 |
| 6,234,648 B1 | 5/2001 | Borner et al. | |
| 6,258,699 B1 | 7/2001 | Chang et al. | 438/458 |
| 6,274,924 B1 | 8/2001 | Carey et al. | 257/676 |
| 6,303,405 B1 | 10/2001 | Yoshida et al. | 438/458 |
| 6,365,429 B1 | 4/2002 | Kneissl et al. | 438/46 |
| 6,375,340 B1 | 4/2002 | Biebl | |
| 6,410,942 B1 | 6/2002 | Thibeault et al. | 257/88 |
| 6,420,199 B1 | 7/2002 | Coman et al. | 438/22 |
| 6,420,242 B1 | 7/2002 | Cheung et al. | 438/458 |
| 6,429,460 B1 | 8/2002 | Chen et al. | 257/79 |
| 6,448,102 B1 | 9/2002 | Kneissl et al. | 438/46 |
| 6,465,809 B1 | 10/2002 | Furukawa et al. | 257/94 |
| 6,468,824 B2 | 10/2002 | Chen et al. | 438/46 |
| 6,480,389 B1 | 11/2002 | Shie | |
| 6,489,637 B1 | 12/2002 | Sakamoto | |
| 6,513,949 B1 | 2/2003 | Marshall et al. | |
| 6,538,371 B1 | 3/2003 | Duggal et al. | |
| 6,550,949 B1 | 4/2003 | Bauer et al. | |
| 6,552,495 B1 | 4/2003 | Chang | |
| 6,559,075 B1 | 5/2003 | Kelly et al. | 438/795 |
| 6,562,648 B1 | 5/2003 | Wong et al. | 438/46 |
| 6,573,537 B1* | 6/2003 | Steigerwald et al. | 257/103 |
| 6,577,073 B2 | 6/2003 | Shimizu et al. | |
| 6,607,931 B2 | 8/2003 | Streubel | 438/22 |
| 6,657,236 B1 | 12/2003 | Thibeault et al. | 257/98 |
| 6,677,173 B2 | 1/2004 | Ota | 438/22 |
| 6,692,136 B2 | 2/2004 | Marshall et al. | |
| 6,716,654 B2 | 4/2004 | Hsu et al. | 438/22 |
| 6,740,604 B2 | 5/2004 | Kelly et al. | 438/795 |
| 6,741,029 B2 | 5/2004 | Matsubara | |
| 6,757,314 B2 | 6/2004 | Kneissl et al. | 372/50 |
| 6,784,463 B2 | 8/2004 | Camras et al. | |
| 6,786,390 B2 | 9/2004 | Yang et al. | 228/179.1 |
| 6,791,119 B2 | 9/2004 | Slater et al. | 257/99 |
| 6,791,259 B1 | 9/2004 | Stokes | |
| 6,800,500 B2 | 10/2004 | Coman et al. | 438/22 |
| 6,806,112 B1 | 10/2004 | Horng et al. | 438/29 |
| 6,809,341 B2 | 10/2004 | Hsu et al. | 257/79 |
| 6,809,347 B2 | 10/2004 | Tasch et al. | |
| 6,817,735 B2 | 11/2004 | Shimizu et al. | |
| 6,821,804 B2 | 11/2004 | Thibeault et al. | 438/29 |
| 6,841,804 B1 | 1/2005 | Chen et al. | |
| 6,846,686 B2 | 1/2005 | Saeki et al. | 438/22 |
| 6,849,878 B2 | 2/2005 | Bader et al. | 257/103 |
| 6,869,812 B1 | 3/2005 | Liu | |
| 6,884,647 B2 | 4/2005 | Sakai et al. | 438/30 |
| 6,914,267 B2 | 7/2005 | Fukasawa et al. | |
| 6,936,857 B2 | 8/2005 | Doxsee et al. | |
| 6,953,255 B2 | 10/2005 | Horiuchi | |
| 6,972,438 B2 | 12/2005 | Li et al. | 257/98 |
| 7,005,679 B2 | 2/2006 | Tarsa et al. | |
| 7,008,078 B2 | 3/2006 | Shimizu et al. | |
| 7,014,336 B1 | 3/2006 | Ducharme et al. | |
| 7,015,511 B2 | 3/2006 | Sakai et al. | 257/94 |
| 7,066,623 B2 | 6/2006 | Lee et al. | |
| 7,095,056 B2 | 8/2006 | Vitta et al. | |
| 7,213,940 B1 | 5/2007 | Van De Ven et al. | |
| 7,869,483 B2 | 1/2011 | Uchida et al. | 372/99 |
| 8,067,254 B2* | 11/2011 | Camras et al. | 438/27 |
| 2002/0139990 A1 | 10/2002 | Suehiro et al. | |
| 2002/0153835 A1 | 10/2002 | Fujiwara et al. | |
| 2002/0163302 A1 | 11/2002 | Nitta | |
| 2002/0180351 A1 | 12/2002 | McNulty | |
| 2003/0030063 A1 | 2/2003 | Sosniak et al. | |
| 2003/0124752 A1 | 7/2003 | Wei et al. | |
| 2003/0146411 A1 | 8/2003 | Srivastava et al. | |
| 2003/0151361 A1 | 8/2003 | Ishizaka | |
| 2003/0173602 A1 | 9/2003 | Hsu et al. | |
| 2003/0189217 A1 | 10/2003 | Imai | |
| 2003/0209714 A1* | 11/2003 | Taskar et al. | 257/79 |
| 2004/0070004 A1 | 4/2004 | Eliashevich et al. | |
| 2004/0072382 A1 | 4/2004 | Kelly et al. | |
| 2004/0094774 A1 | 5/2004 | Steigerwald et al. | |
| 2004/0105261 A1 | 6/2004 | Ducharme et al. | |
| 2004/0188697 A1 | 9/2004 | Brunner et al. | |
| 2004/0217364 A1 | 11/2004 | Tarsa et al. | |
| 2005/0077531 A1 | 4/2005 | Kim | |
| 2005/0082562 A1 | 4/2005 | Ou et al. | |
| 2005/0082974 A1 | 4/2005 | Fukasawa et al. | |
| 2005/0104080 A1 | 5/2005 | Ichihara et al. | |
| 2005/0224821 A1 | 10/2005 | Sakano | |
| 2005/0227379 A1 | 10/2005 | Donofrio | |
| 2006/0006404 A1 | 1/2006 | Ibbetson | |
| 2006/0012989 A1 | 1/2006 | Lee | |
| 2006/0060888 A1* | 3/2006 | Kim et al. | 257/200 |
| 2006/0063289 A1 | 3/2006 | Negley | |
| 2006/0105482 A1 | 5/2006 | Alferink et al. | |
| 2006/0154392 A1 | 7/2006 | Tran et al. | |
| 2006/0255341 A1 | 11/2006 | Pinnington et al. | |
| 2006/0273335 A1 | 12/2006 | Asahara | |
| 2007/0057271 A1 | 3/2007 | Schiaffino et al. | |
| 2007/0200127 A1 | 8/2007 | Andrews et al. | |
| 2007/0215890 A1 | 9/2007 | Harbers et al. | |
| 2007/0262338 A1 | 11/2007 | Higashi et al. | |
| 2007/0295968 A1 | 12/2007 | Tan et al. | |
| 2008/0048200 A1 | 2/2008 | Mueller et al. | |
| 2008/0173884 A1 | 7/2008 | Chitnis et al. | |
| 2008/0217635 A1 | 9/2008 | Emerson | |
| 2008/0296589 A1 | 12/2008 | Speier et al. | |
| 2008/0308825 A1 | 12/2008 | Chakraborty et al. | |
| 2008/0315228 A1* | 12/2008 | Krames et al. | 257/98 |
| 2009/0057690 A1* | 3/2009 | Chakraborty | 257/88 |
| 2009/0173958 A1* | 7/2009 | Chakraborty et al. | 257/98 |
| 2011/0018013 A1* | 1/2011 | Margalith et al. | 257/91 |
| 2011/0132521 A1* | 6/2011 | Paolini et al. | 156/67 |

FOREIGN PATENT DOCUMENTS

| | | |
|---|---|---|
| EP | 1 05 9 66 7 A2 | 12/2000 |
| EP | 10 59 66 7 | 12/2000 |
| EP | 1059678 A2 | 12/2000 |
| EP | 11 56 02 0 A1 | 11/2001 |
| EP | 1198016 A2 | 4/2002 |
| EP | 12 46 26 6 | 10/2002 |
| EP | 1263058 A | 12/2002 |
| EP | 1345275 A | 9/2003 |
| GB | 2 28 2 70 0 A | 4/1995 |
| JP | 61 05 9886 | 3/1986 |
| JP | 07007180 | 1/1995 |
| JP | 09-153646 | 6/1997 |
| JP | 10-163535 | 6/1998 |
| JP | 10312990 | 11/1998 |
| JP | 11 238913 | 8/1999 |
| JP | 11-307813 | 11/1999 |
| JP | 2000-353826 | 12/2000 |
| JP | 2001217467 | 8/2001 |
| JP | 2002-57376 | 2/2002 |
| JP | 2002270515 | 9/2002 |
| JP | 2002-299699 | 10/2002 |
| JP | 2003-124522 | 4/2003 |
| JP | 2003-515956 | 5/2003 |
| JP | 2003533030 | 5/2003 |
| JP | 2003209283 | 7/2003 |
| JP | 2003218383 | 7/2003 |
| JP | 2003-529889 | 10/2003 |
| JP | 2004-031856 | 1/2004 |
| JP | 2004031856 | 1/2004 |
| JP | 2004-080046 | 3/2004 |
| JP | 2004-103443 | 4/2004 |
| JP | 2004-356116 | 12/2004 |
| JP | 2005-142311 | 6/2005 |
| JP | 2005-191514 | 7/2005 |
| JP | 2005191514 | 7/2005 |
| JP | 2005-232305 | 9/2005 |
| JP | 2006-049799 | 2/2006 |
| JP | 2006-313902 | 11/2006 |
| JP | 2007-149909 | 6/2007 |
| KR | 2002-77135 | 10/2002 |
| WO | WO 83/00408 A1 | 2/1983 |

| | | | |
|---|---|---|---|
| WO | WO 01/41225 A2 | 6/2001 |
| WO | WO 03 005458 A1 | 1/2003 |
| WO | WO 03 010832 | 2/2003 |
| WO | WO 03/065464 A1 | 8/2003 |
| WO | WO2004/100279 | 11/2004 |
| WO | 2005/0262338 A1 | 5/2005 |
| WO | WO 2005/124877 | 12/2005 |
| WO | 2006/0057271 A1 | 4/2006 |
| WO | WO 2007/063460 A1 | 6/2007 |
| WO | WO 2007/141763 A1 | 12/2007 |
| WO | WO 2009/039805 A1 | 4/2009 |

OTHER PUBLICATIONS

Office Action from U.S. Appl. No. 12/002,429, dated: Sep. 12, 2011.
Office Action from U.S. Appl. No. 12/384,277, dated: Oct. 11, 2011.
Office Action from U.S. Appl. No. 11/708,990, dated: Nov. 15, 2011.
Office Action from U.S. Appl. No. 11/523,381, dated: Dec. 2, 2011.
International Search Report and Written Opinion for PCT/US2010/024980 mailed Oct. 6, 2010.
Office Action for German Patent Application No. 10 2008 029 318.0 dated mailed Dec. 13, 2010.
Extended European Search Report for European Patent Application No. 10185708.4 mailed Dec. 2, 2010.
Office Action for Korean Patent Application No. 10-2005-7020463 mailed Dec. 21, 2010.
Office Action from U.S. Appl. No. 12/821,069, dated: Dec. 28, 2010.
Office Action from U.S. Appl. No. 12/002,429, dated: Jan. 28, 2011.
Notice of Reasons for Rejection from Japanese Patent Application No. 2008-037765 dated Mar. 23, 2011.
Summary of Notice of Reasons for Rejection for Japanese Patent Application No. 2007-520314 mailed May 10, 2011.
Office Action for Japanese Patent Application No. JP 2008-163311 issued Mar. 29, 2011.
Office Action for Japanese Patent Application No. JP 2006-513442 mailed May 12, 2011.
International Search Report and Written Opinion for counterpart PCT Application No. PCT/US2011/000381 mailed Jun. 8, 2011.
First Office Action from Chinese Patent Application No. 200910137491.3 mailed Apr. 14, 2010.
Office of the IPO for Taiwan Patent Application No. TW 093112133 issued Jun. 23, 2011.
From European application 05 761 972.8-1235: European Office Action dated Dec. 12, 2009.
U.S. Appl. No. 11/613,692, filed Dec. 20, 2006.
U.S. Appl. No. 11/614,180, filed Dec. 21, 2006.
U.S. Appl. No. 11/613,714, filed Dec. 20, 2006.
U.S. Appl. No. 11/624,811, filed Jan. 19, 2007.
U.S. Appl. No. 11/626,483, filed Jan. 24, 2007.
U.S. Appl. No. 11/743,754, filed May 3, 2007.
U.S. Appl. No. 11/751,982, filed May 22, 2007.
U.S. Appl. No. 11/753,103, filed May 24, 2007.
U.S. Appl. No. 11/751,990, filed May 22, 2007.
U.S. Appl. No. 11/736,761, filed Apr. 18, 2007.
U.S. Appl. No. 11/736,799, filed Apr. 18, 2007.
U.S. Appl. No. 11/755,153, filed May 30, 2007.
U.S. Appl. No. 11/856,421, filed Sep. 17, 2007.
U.S. Appl. No. 11/859,048, field Sep. 21, 2007.
U.S. Appl. No. 11/939,047, filed Nov. 13, 2007.
U.S. Appl. No. 11/936,163, filed Nov. 7, 2007.
U.S. Appl. No. 11/843,243, filed Aug. 22, 2007.
U.S. Appl. No. 11/948,021, filed Nov. 30, 2007.
U.S. Appl. No. 11/870,679, filed Oct. 11, 2007.
U.S. Appl. No. 11/951,626, filed Dec. 6, 2007.
U.S. Appl. No. 12/117,122, filed May 8, 2008.
U.S. Appl. No. 12/117,131, filed May 8, 2008.
U.S. Appl. No. 12/117,136, filed May 8, 2008.
U.S. Appl. No. 11/947,323, filed Nov. 29, 2007.
U.S. Appl. No. 12/035,604, filed Feb. 22, 2008.
U.S. Appl. No. 12/117,148, filed May 8, 2008.
U.S. Appl. No. 12/117,271, filed May 8, 2008.
U.S. Appl. No. 11/895,573, filed Aug. 24, 2007.
U.S. Appl. No. 11/835,044, filed Aug. 7, 2007.
U.S. Appl. No. 12/248,220, filed Oct. 9, 2008.
U.S. Appl. No. 12/277,745, filed Nov. 25, 2008.
Van de Ven et al., "Warm White Illumination with High CRI and High Efficacy by Combining 455 nm Excited Yellowish Phosphor LEDs and Red AlInGaP LEDs", First International Conference on White LEDs and Solid State Lighting.
Cree® XLamp® 7090 XR-E Series LED Binning and Labeling.
PCT International Search Report and Written Opinion from related PCT application No. PCT/US2008/010703, date: Aug. 26, 2009.
Lagoubi, et al. "Conditioning of N-Silicon by Photoelectrochemical Etching for Photovoltaic Applications", Proc. of the 11$^{th}$ E.C. Photovoltaic Solar Energy Conference, Oct. 12, 1992-Oct. 16, 1992, pp. 250-253, XP008043956, pp. 252-253 Figure 8.
Patent Abstracts of Japan 07007179, Oct. 1995, Sanyo Electric Co Ltd, "Light Emitting Elements".
Journal of Optics A: Pure and Applied Optics 7 (2005) S3-S11, Review Article "Left-Handed Electromagnetism Obtained Via Nanostructured Metamaterials: Comparison With That From Microstructured Photonic Crystals", Mathias Perrin et al.
Journal of Modern Optics vol. 52, No. 8, May 2005, pp. 1155-1160, "Design and Fabrication of Omnidirectional Reflectors in the Visible Range", Weihua Lin et al.
American Institute PF Physics Handbook, Third Edition, McGraw-Hill, Ed: Dwight E. Gray, 1972.
Kasugai et al., "Moth-Eye Light-Emitting Diodes", Mater Res. Soc. Symp. Proc. vol. 831, 2005 Materials Research Society, pp. E1.9.1-E1.9.6.
Khan F. A. at al, "High Rate Etching of SIC Using Inductively Coupled Plasma Reactive Ion Etching in SF6-Based Gas Mixtures", Applied Physics Letters, AIP, American Institute of Physics, Melville, NY, US, vol. 75, No. 15, Oct. 11, 1999 pp. 2268-2270.
Palmour J W et al., "Crystallographic Etching Phenomenon During Plasma Etching of SIC (100) Thin Films in SF6", Journal of the Electrochemical Society. Electrochemical Society, Manchester, New Hampshire, U.S., vol. 136, No. 2, Feb. 1, 1989, pp. 491-495.
Kelner G. et al., "Plasma Etching of BETA-SIC", Journal of the Electrochemical Society. Electrochemical Society, Manchester, New Hampshire, U.S. vol. 134, No. 1, Jan. 1987, pp. 253-254.
Windisch et al., *Impact of Texture-Enhanced Transmission on High-Efficiency Surface-Textured Light-Emitting Diodes*, Applied Physics Letters, vol. 79, No. 15, Oct. 8, 2001, pp. 2315-2317.
Schnitzer at al., *30% External Quantum Efficiency From Surface Textured, Thin-Film Light-Emitting Diodes*, Applied Physics Lett. 63(16), Oct. 18, 1993, pp. 2174-2176.
Windisch et al., *Light-Extraction Mechanisms in High-Efficiency Surface-Textured Light-Emitting Diodes*, IEEE Journal on Selected Topics in Quantum Electronics, vol. 8, No. 2, Mar./Apr. 2002, pp. 248-255.
Streubel et al., *High Brightness AlGaInP Light-Emitting Diodes*. IEEE Journal on Selected Topics in Quantum Electronics, vol. 8, No. 2, Mar./Apr. 2002, pp. 321-332.
Shor et al., *Direct Observation of Porous SiC Formed by Anodization in HF*, Appl. Phys. Lett. 62 (22), May 31, 1993, pp. 2836-2838.
Windisch at al., *40% Efficient Thin-Film Surface-Textured Light-Emitting Diodes by Optimization of Natural Lithography*, IEEE Transactions on Electron Devices, vol. 47, No. 7, Jul. 7, 2000. pp. 1492-1498.
Windisch et al., *Non-Resonant Cavity Light-Emitting Diodes*, In Light-Emitting Diodes: Research, Manufacturing, and Applications 1V, H. Walter Yao et al., Proceedings of SPIE vol. 3938 (2000), pp. 70-76.
Zangooie et al., *Surface, Pore Morphology, and Optical Properties of Porous 4H-SiC*, Journal of the Electrochemical Society, 148(6) G297-G302 (2001) Jan. 9, 2001.
Mimura et al, *Blue Electroluminescence From Porous Silicon Carbide*, Appl. Phys. Lett 65(26), Dec. 26, 1994, pp. 3350-3352.
First Examination Report dated: Apr. 4, 2008 from Indian Patent application No. 4867/DELNP/2005.
Nichia Corp white LED Part No. NSPW312BS, data sheet available from http://store.nichia.com/index.asp?PageAction=VIEWPROD&ProdID=12, on Apr. 7, 2006.
Nichia Corp white LED Part No. NSPW300BS, data sheet available from http://store.nichia.com/index.asp?PageAction=VIEWPROD&ProdID=6, on Apr. 7, 2006.

Dow Chemical. Silicon Product No. OE-6665 data sheet 2008.

PCT/US05/20603 International Preliminary Report, dated: Mar. 27, 2008.

Office Action from U.S. Appl. No. 10/836,743, dated: Dec. 8, 2009.

Response to Office Action from U.S. Appl. No. 10/836,743, filed: Apr. 8, 2010.

Response to Office Action from U.S. Appl. No. 12/821,069, filed: Apr. 25, 2011.

Office Action from U.S. Appl. No. 11/985,410, dated: Jan. 4, 2010.

Response to Office Action from U.S. Appl. No. 11/985,410, filed: May 11, 2010.

Office Action from U.S. Appl. No. 10/836,743, dated: Apr. 29, 2010.

Response to Office Action from U.S. Appl. No. 10/836,743, filed: Aug. 30, 2010.

Office Action from U.S. Appl. No. 12/384,277, dated: May 13, 2010.

Response to Office Action from U.S. Appl. No. 12/384,277, filed: Sep. 2, 2010.

Office Action from U.S. Appl. No. 11/708,990, dated: May 26, 2010.

Response to Office Action from U.S. Appl. No. 11/708,990, filed: Nov. 18, 2010.

Office Action from U.S. Appl. No. 11/985,410, dated: Jul. 15, 2010.

Response to Office Action from U.S. Appl. No. 11/985,410, filed: Dec. 14, 2010.

Office Action from U.S. Appl. No. 12/845,629, dated: Sep. 29, 2010.

Response to Office Action from U.S. Appl. No. 12/845,629, filed: Jan. 26, 2011.

Office Action from U.S. Appl. No. 10/836,743, dated: Feb. 14, 2011.

Response to Office Action from U.S. Appl. No. 10/836,743, filed: Apr. 27, 2011.

Office Action from U.S. Appl. No. 11/708,990, dated: Feb. 16, 2011.

Office Action from U.S. Appl. No. 11/523,381, dated: Sep. 30, 2010.

Response to Office Action from U.S. Appl. No. 11/523,381, filed: Nov. 24, 2010.

Office Action from U.S. Appl. No. 11/523,381, dated: Mar. 21, 2011.

Response to Office Action from U.S. Appl. No. 11/523,381, filed: Jun. 20, 2011.

Office Action from U.S. Appl. No. 10/836,743, dated: Jun. 15, 2011.

Office Action from U.S. Appl. No. 12/384,277, dated: Apr. 28, 2011.

Notice of Allowance from U.S. Appl. No. 12/821,069, dated: Jun. 15, 2011.

Office Action from U.S. Appl. No. 12/845,629, dated: Apr. 6, 2011.

Office Action from U.S. Appl. No. 12/002,429, dated: Jun. 9, 2010.

Response to Office Action from U.S. Appl. No. 12/002,429, filed: Dec. 1, 2010.

Response to Office Action from U.S. Appl. No. 12/002,429, filed: Dec. 21, 2011.

Response to Office Action from U.S. Appl. No. 11/708,990. filed: Feb. 15, 2012.

Office Action from U.S. Appl. No. 10/836,743. dated: Jan. 26, 2012.

Office Action from U.S. Appl. No. 12/002,429. dated: Feb. 1, 2012.

Notice of Reasons for Rejection for Japanese Patent Application No. 2006-533962, dated May 22, 2012.

Joseph S. Shor, et al., "Direct observation of porous SiC formed by anodization in HF", Appl. Phys. Lett. 62 (22). May 31, 1993.

Summary of Final Notice of Reasons for Rejection from Japanese Patent Application No. 2007-520314. dated May 8. 2012.

Examination Report from European Application No. 04 788 908.4-1224. dated Jun. 8, 2012.

Notice of Reasons for Rejection from Japanese Patent Application No. 2006-533962, dated Dec. 26, 2011.

Notification of Second Office Action from Chinese Patent Application No. 200780014958.4, dated Dec. 21, 2011.

Decision of Rejection from Japanese Patent Application No. 2009-507696, dated Dec. 26, 2011.

Communication pursuant to Article 94(3) EPC from Patent Application No. 04 788 908.4-1224, dated Jan. 27, 2012.

Notification of Reason(s) for Rejection for Japanese Patent Application No. 2008-309821 dated Sep. 12, 2011.

Notification of the Second Office Action for CN 200910137491.3 mailed Dec. 23, 2011.

* cited by examiner

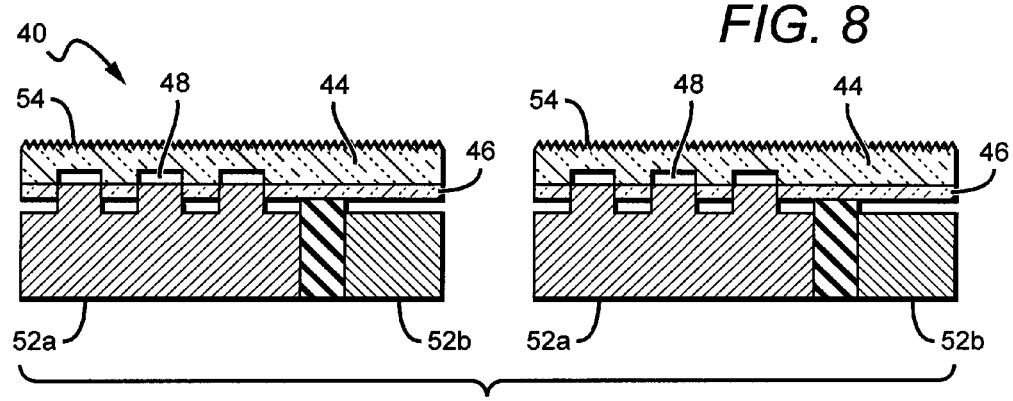
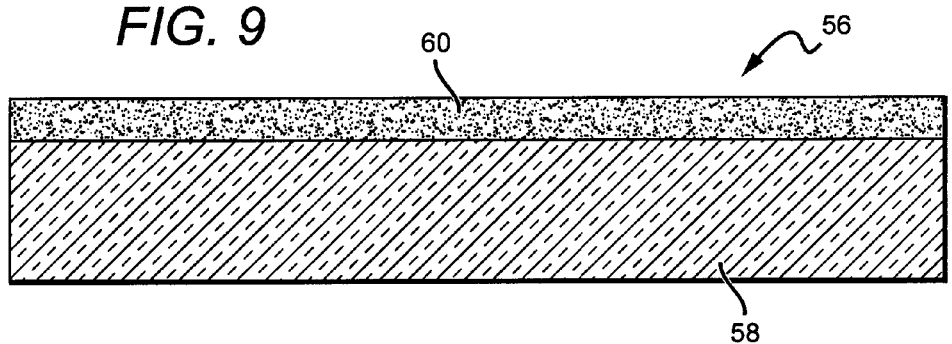
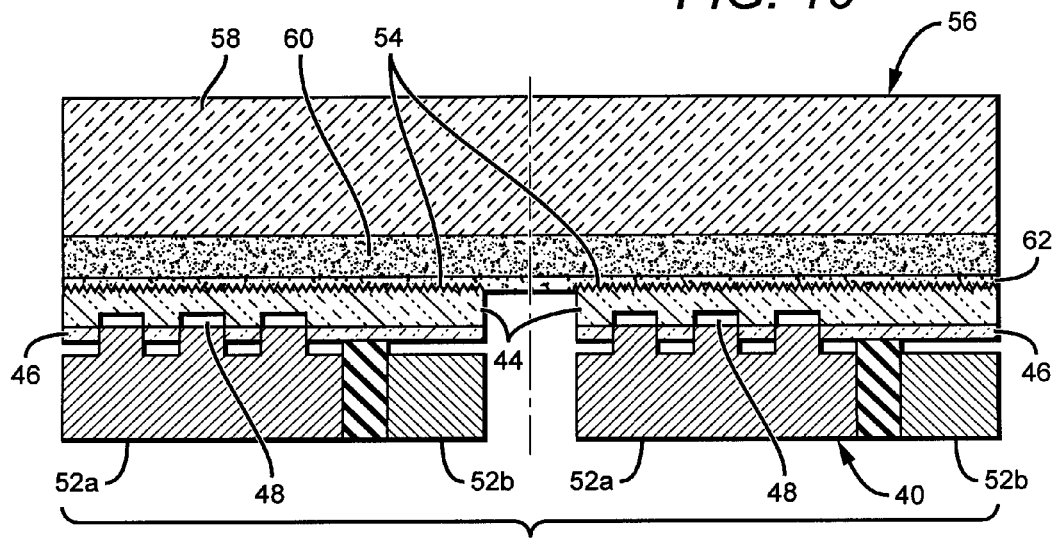

WHITE-EMITTING LED CHIPS AND METHOD FOR MAKING SAME

The invention was made with Government support under Contract No. FA8650-05-2-5507. The Government has certain rights in this invention.

BACKGROUND OF THE INVENTION

1. Field of the Invention

The present invention relates generally to semiconductor devices, and more particularly to wire-bond free, white light emitting devices and methods for fabricating the same.

2. Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

Conventional LEDs cannot generate white light from their active layers. Light from a blue emitting LED has been converted to white light by surrounding the LED with a yellow phosphor, polymer or dye, with a typical phosphor being cerium-doped yttrium aluminum garnet (Ce:YAG). [See Nichia Corp. white LED, Part No. NSPW300BS, NSPW312BS, etc.; See also U.S. Pat. No. 5,959,316 to Lowrey, "Multiple Encapsulation of Phosphor-LED Devices"]. The surrounding phosphor material down-converts the wavelength of some of the LED's blue light, changing its color to yellow. Some of the blue light passes through the phosphor without being changed while a substantial portion of the light is down-converted to yellow. The LED emits both blue and yellow light, which combine to provide a white light. In another approach light from a violet or ultraviolet emitting LED has been converted to white light by surrounding the LED with multicolor phosphors or dyes.

One method used to fabricate efficient semiconductor devices is called flip-chip, or wire-bond free, mounting. Flip-chip mounting of LEDs involves mounting the LED onto a submount substrate-side up. Light is then extracted and emitted through the transparent substrate, or the substrate may be removed altogether. Flip-chip mounting is an especially desirable technique for mounting SiC-based LEDs. Since SiC has a higher index of refraction than GaN, light generated in the active region does not internally reflect (i.e. reflect back into the GaN-based layers) at the GaN/SiC interface. Flip-chip mounting of SiC-based LEDs offers improved light extraction when employing certain chip-shaping techniques known in the art. Flip-chip packaging of SiC LEDs has other benefits as well, such as improved heat extraction/dissipation, which may be desirable depending on the particular application for the chip.

Various approaches for the fabrication of white-emitting, flip-chip mounted devices have been attempted. For example, Philips Lumileds has developed a thin film flip-chip technology which they combine with their "Lumiramic" phosphor plates to create white-emitting, wire-bond free LEDs. To manufacture these devices, multiple fabrication steps are carried out at the singulated chip level. Base LEDs are individually flip-chip mounted to submount wafers prior to removing the LED substrate. The Lumiramic plates are then bonded to each chip individually.

As another example, in U.S. Patent Pub. No. 2008/0173884 (assigned to the same assignee as the present invention), the wire-bond free wafer is coated with phosphor-loaded silicone and then cured after it is fabricated. The coated wafers can then be further processed by grinding down the phosphor coating to a uniform thickness. Finally, the wafers are diced, and the singulated chips are placed for die attachment.

While flip-chip, or wire-bond free, LED chip designs are suitable for a variety of applications, white-emitting flip-chip devices can be difficult to fabricate. To maximize the overall light extraction while limiting the light emission from the sidewalls of the devices, the LED wafer substrate may be thinned or entirely removed. As such, the mechanical support for the remaining material is essentially provided by: the electrodes, and the package or submount the devices are flip-chip mounted onto. This can result in devices that are mechanically delicate and subject to low-yield during fabrication and die handling. Reliability problems after packaging can also be an issue.

Additionally, the base LED materials (such as SiC, GaN, and various contact metals) may have relatively low coefficients of thermal expansion (CTE), such as in the <20 ppm/° C. range. Alternatively, some of the materials provided to make the chips emit white light (such as silicone coating) have high CTE, such as in the >100 ppm/° C. range. The low CTE and high CTE materials are typically attached to one another to form a completed device, thus creating a CTE mismatch. The CTE mismatch may exacerbate the mechanically delicate nature of the white-emitting, flip-chip devices. This may lead to device failure during temperature cycles.

SUMMARY OF THE INVENTION

The present invention provides apparatuses and methods for fabricating semiconductor devices, such as white-emitting, flip-chip lighting devices, that are highly efficient and mechanically robust. The fabrication of the devices allows for higher yields and lower costs by performing process steps at the wafer level rather than the chip level. One embodiment according to the present invention comprises a method for fabricating LED chips. The method comprises pre-forming a capping wafer, with the capping wafer comprising a conversion material. A wire-bond free LED wafer comprising a plurality of LEDs is fabricated. The capping wafer is then bonded to the LED wafer using an adhesive. Finally, the LED chips are singulated upon the completion of all final fabrication steps.

Pursuant to another embodiment according to the present invention, an LED chip wafer is provided comprising a submount wafer and a plurality of LEDs flip-chip mounted on the submount wafer. A capping wafer is also provided, which is bonded to the LEDs using an adhesive. The capping wafer comprises a conversion material. At least some of the light emitted from the LEDs passes through the capping wafer where at least some of the light is converted by the conversion material.

In another embodiment according to the present invention, a wire-bond free LED chip is provided. Further, a capping wafer is provided, which is bonded to the LED using an adhesive. The capping wafer serves as a mechanical support for the LED chip. A conversion material is integrated in the capping wafer, with the conversion material converting at least some of the light emitted from said LED.

These and other further features and advantages of the invention would be apparent to those skilled in the art from the following detailed description, taken together with the accompanying drawings, in which:

BRIEF DESCRIPTION OF THE DRAWINGS

FIG. 8 is a sectional view of the LED wafer of FIG. 7 after substrate removal and GaN surface etch;

FIG. 9 is a sectional view of one embodiment of a capping wafer according to the present invention;

FIG. 10 is a sectional view of the capping wafer of FIG. 9 bonded to the LED wafer of FIG. 8;

DETAILED DESCRIPTION OF THE INVENTION

Figure 1:
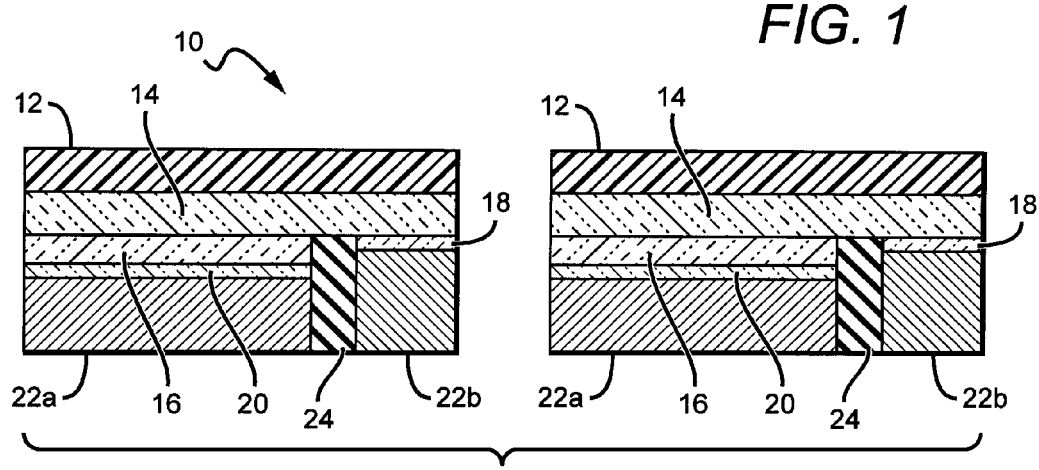
FIG. 1 is a sectional view of one embodiment of an LED wafer at a fabrication step in one method according to the present invention.

The present invention provides fabrication methods that are particularly applicable to wafer level capping of semiconductor devices such as LEDs. The present invention also provides semiconductor devices, such as LEDs fabricated using these methods, and related LED packages and LED arrays. The present invention provides for methods of making devices and devices that can be surface mounted or can otherwise be wire-bond free. A capping layer is mounted to the LED wafer and has certain characteristics that can decrease the likelihood that LEDs in the wafer or the other wafer layers of the structure would be damaged during heat cycles. In some embodiments, the capping layer has characteristics that reduce the likelihood that the LEDs or other wafer layers will be damaged during the thermal cycle of the LEDs being mounted to a package or submount. This temperature cycle can heat the LEDs up to approximately 300° C., which has been shown to introduce stresses on layers having differing characteristics.

In one embodiment, the capping wafer (or layer) is bonded to the LED wafer using an adhesive layer, and in some embodiments the capping wafer may include a down-converter. In some embodiments, the capping wafer is characterized as having a coefficient of thermal expansion ("CTE") that is close to that of the LED layers in the LED wafer. This allows the capping wafer and LED wafer to expand at similar rates during heat cycles, which reduces the stress between the two. This in turn reduces the damage to the LED wafer that might otherwise be caused by the stresses. In other embodiments, the capping layer can have a CTE that is close to that of the package or submount that the LED is mounted to. This also reduces the stresses experience by the LED during the attachment thermal cycle. After the capping wafer is bonded, final fabrication steps may be applied to the unbonded surface of the LED wafer opposite the capping wafer, such that the capping wafer acts as a robust, mechanical support. It is notable that all fabrication steps are completed at the wafer level prior to device singulation.

The present invention is described herein with reference to certain embodiments but it is understood that the invention can be embodied in many different forms and should not be construed as limited to the embodiments set forth herein. In particular, the present invention is described below in regards to capping LED wafers with a down-converter capping wafer/layer that typically comprises a phosphor-loaded silicone coating, but it is understood that the capping wafer may be coated with other materials for down-conversion, protection, light extraction or scattering. The capping material can also have a conversion material mixed within it, instead of a conversion material coating. The methods according to the present invention can also be used for capping other semiconductor devices with different materials. Additionally, single or multiple coatings and/or layers can be formed on the capping wafer. A coating can include no phosphors, one or more phosphors, scattering particles and/or other materials. A coating may also comprise a material such as an organic dye that provides down-conversion. With multiple coatings and/or layers, each one can include different phosphors, different scattering particles, different optical properties, such as transparency, index of refraction, and/or different physical properties, as compared to other layers and/or coatings.

LEDs can have many different semiconductor layers arranged in different ways and can emit many different colors in different embodiments according to the present invention. LED structures, features, and their fabrication and operation are generally known in the art and only briefly discussed herein. The layers of the LEDs can be fabricated using known processes, with a suitable process being fabrication using metal organic chemical vapor deposition (MOCVD). The layers of the LED chips generally comprise an active layer/region sandwiched between first and second oppositely doped epitaxial layers, all of which are formed successively on a growth substrate. LED chips can be formed on a wafer and then singulated for mounting in a package. It is understood that the growth substrate can remain as part of the final singulated LED or the growth substrate can be fully or partially removed.

Furthermore, LEDs may have vertical or lateral geometry as is known in the art. Those comprising a vertical geometry may have a first contact on a substrate and a second contact on a p-type layer. An electrical signal applied to the first contact spreads into the n-type layer and a signal applied to the second contact spreads into a p-type layer. In the case of Group-III nitride devices, it is well known that a thin semitransparent current spreading layer typically covers some or all of the p-type layer. It is understood that the second contact can include such a layer, which is typically a metal such as platinum (Pt) or a transparent conductive oxide such as indium tin oxide (ITO).

LEDs may also comprise a lateral geometry, wherein both contacts are on the top of the LEDs. A portion of the p-type layer and active region is removed, such as by etching, to expose a contact mesa on the n-type layer. A second lateral n-type contact is provided on the mesa of the n-type layer. The contacts can comprise known materials deposited using known deposition techniques.

It will be understood that when an element is referred to as being "on", "connected to", "coupled to" or "in contact with" another element, it can be directly on, connected or coupled to, or in contact with the other element or intervening elements may be present. In contrast, when an element is referred to as being "directly on," "directly connected to", "directly coupled to" or "directly in contact with" another element, there are no intervening elements present. Likewise, when a first element is referred to as being "in electrical contact with" or "electrically coupled to" a second element, there is an electrical path that permits current flow between the first element and the second element. The electrical path may include capacitors, coupled inductors, and/or other elements that permit current flow even without direct contact between conductive elements.

Although the terms first, second, etc. may be used herein to describe various elements, components, regions, and/or sections, these elements, components, regions, and/or sections should not be limited by these terms. These terms are only used to distinguish one element, component, region, or section from another element, component, region, or section. Thus, a first element, component, region, or section discussed below could be termed a second element, component, region, or section without departing from the teachings of the present invention.

Embodiments of the invention are described herein with reference to cross-sectional view illustrations that are schematic illustrations of embodiments of the invention. As such, the actual thickness of components can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in natures and their shapes are not intended to illustrate the precise shape of a region of a device and are not intended to limit the scope of the invention.

Figure 2:
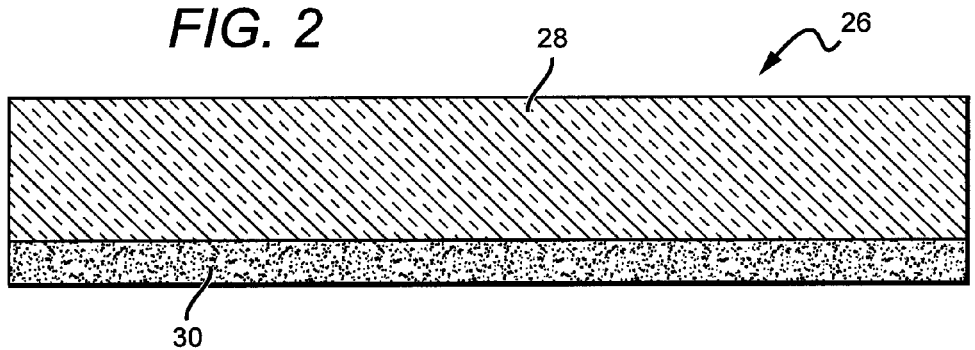
FIG. 2 is a sectional view of one embodiment of a capping wafer according to the present invention.
Figure 3:
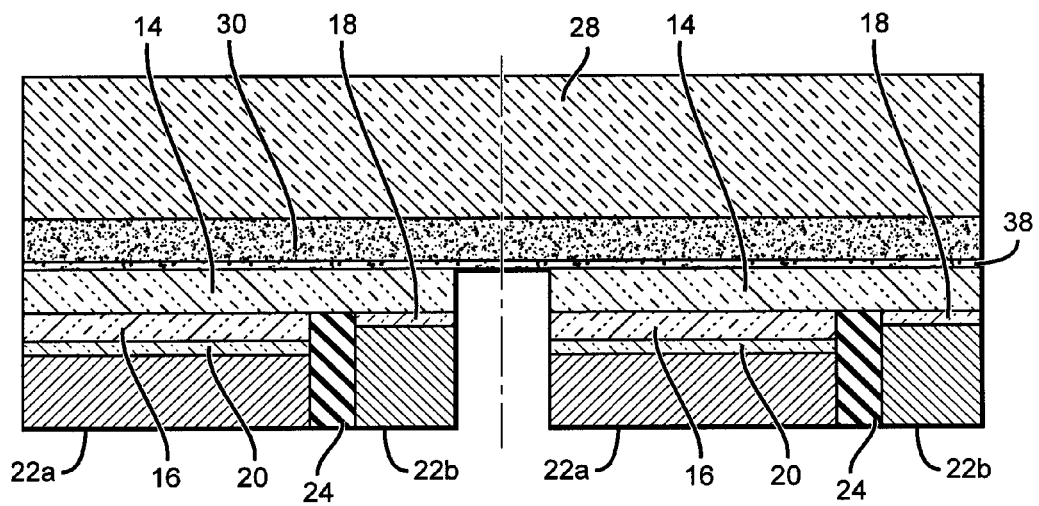
FIG. 3 is a sectional view of the capping wafer of FIG. 2 bonded to the LED wafer of FIG. 1.
Figure 4:
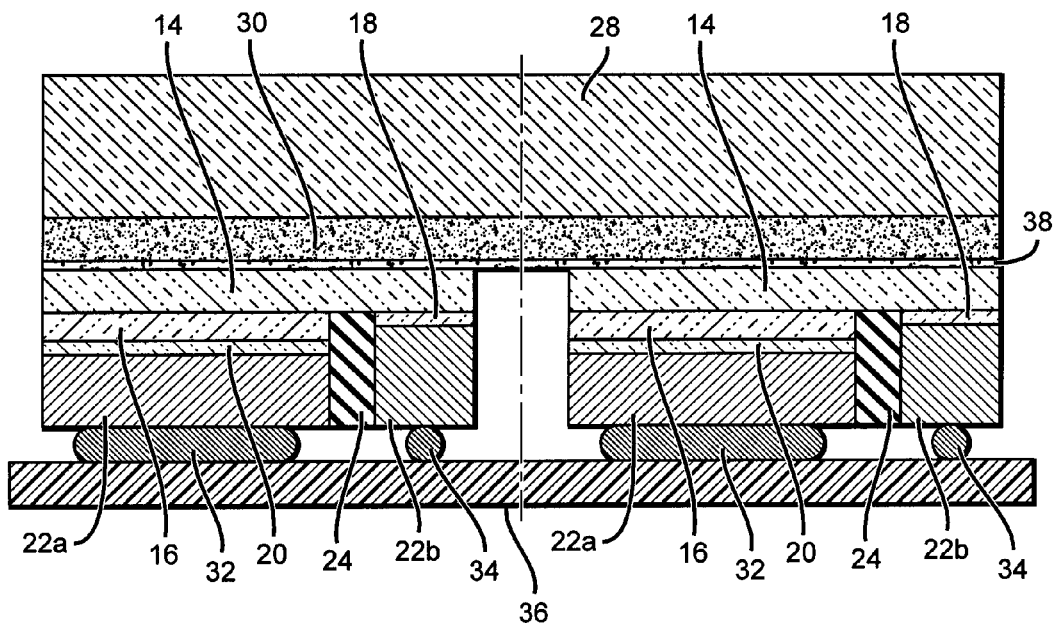
FIG. 4 is a sectional view of a submount wafer and LED wafer in FIG. 3 following flip-chip mounting.
Figure 5:
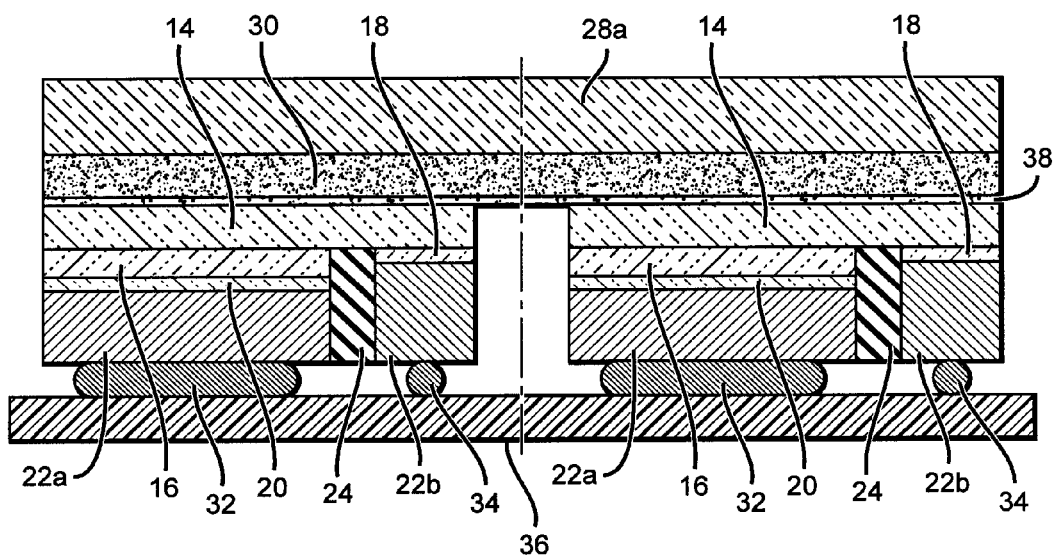
FIG. 5 is a sectional view of the capping wafer, submount wafer, and LED wafer in FIG. 4 following grinding/polishing of the capping wafer.

FIGS. 1-6 show one embodiment of wafer level LED chips 10 manufactured using a method according to the present invention with the series of figures showing the LED chips 10 at fabrication steps. That is, the LED chips 10 are shown in some figures at a point where all the fabrication steps have not been completed before being separated/singulated into individual LED chips. The LED chips comprise LEDs, and for ease of description and understanding the LEDs are shown as separate devices. It is understood, however, that one or more of the LED layers can be continuous so the LEDs can be provided in wafer form. Vertical phantom lines (as shown in FIGS. 3-5) are included to show separation or the dicing line between the LED chips 10 at a later fabrication step. As further described below, this separation or dicing can take place at different points in the fabrication process.

FIGS. 1-6 also show only two devices at the wafer level, but it is understood that many more LED chips can be formed from a single wafer. For example, when fabricating LED chips having a millimeter (mm) square size, up to 4500 LED chips can be fabricated on a 3 inch wafer.

Each of the LEDs can have many different semiconductor layers arranged in different ways. The fabrication and operation of LEDs is generally known in the art and only briefly discussed herein. The layers of the LEDs can be fabricated using known processes with a suitable process being fabrication using metal organic chemical vapor deposition (MOCVD). The layers of the LEDs generally comprise an active layer/region sandwiched between first and second oppositely doped epitaxial layers 14, 16, all of which are formed successively on a substrate 12.

It is understood that additional layers and elements can also be included in the LEDs, including but not limited to buffer, nucleation, contact and current spreading layers as well as light extraction layers and elements. The active region can comprise single quantum well (SQW), multiple quantum well (MQW), double heterostructure or super lattice structures. In one embodiment, the first epitaxial layer 14 is an n-type doped layer and the second epitaxial layer 16 is a p-type doped layer, although in other embodiments the first layer 14 can be p-type doped and the second layer 16 can be n-type doped. The first and second epitaxial layers 14, 16 are hereinafter referred to as n-type and p-type layers, respectively.

The active region and layers 14, 16 of the LEDs may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a preferred embodiment, the n- and p-type layers 14, 16 are gallium nitride (GaN) and the active region is InGaN. In alternative embodiments the n- and p-type layers 14, 16 may be AlGaN, aluminum gallium arsenide (AlGaAs) or aluminum gallium indium arsenide phosphide (AlGaInAsP).

The growth substrate 12 can be made of many materials such as sapphire, silicon carbide (SiC), aluminum nitride (AlN), GaN, Si, with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature as well as in a U.S. Pat. Nos. Re. 34,861; 4,946,547; and 5,200,022. In the embodiment shown, the substrate 12 is at the wafer level, with the plurality of LEDs 10 formed on the wafer substrate 12.

The substrate 12 can have different thicknesses. In an optional processing step, the substrate 12 can also be thinned or removed using known methods such as mechanical grinding, etching, or laser-ablation to allow for easier and more reliable singulating of the LED chips. This thinning or substrate removal can also result in LED chips having the desired thickness. Note that the substrate 12 depicted in FIG. 1 is no longer depicted in FIGS. 3-7, as it has been removed according to one possible embodiment. It is understood that the substrate 12 may alternatively be thinned or untouched. In still other embodiments where the substrate 12 is made of a material that is compatible with shaping, such as silicon carbide, the substrate 12 can include different shapes to enhance light extraction.

The present invention is particularly adapted for use with LEDs arranged so both contacts are accessible from one surface, such as with lateral geometry LEDs as shown. However, it is understood that vertical geometry LEDs may also be used. Lateral geometry devices are usually arranged with a split-level electrode configuration with both electrodes on the top surface of layers on different levels of the device. Thus, the electrodes do not share a common surface but rather a common top-side orientation with respect to the layers on which they are disposed. Charge carriers move laterally through the semiconductor layers for at least a portion of the current path in response to a bias. Several variations of this common geometry are known and used in the art.

Each of the LEDs can have first and second electrodes or contacts 22a, 22b. In the embodiment shown, the first contact 22a is on the mesa of the p-type layer contact 20 and the second contact 22b is in contact with the n-type layer contact 18. An electrical signal applied to the first contact 22a spreads into the p-type layer 16 and a signal applied to the second contact 22b spreads into the n-type layer 14. The first and second contacts can comprise many different materials such as Au, copper (Cu), nickel (Ni), indium (In), aluminum (Al), silver (Ag), or combinations thereof. In still other embodiments, the contacts can comprise conducting oxides and transparent conducting oxides such as indium tin oxide, nickel oxide, zinc oxide, cadmium tin oxide, titanium tungsten nickel, indium oxide, tin oxide, magnesium oxide, $ZnGa_2O_4$, $ZnO_2/Sb$, $Ga_2O_3/Sn$, $AgInO_2/Sn$, $In_2O_3/Zn$, $CuAlO_2$, LaCuOS, $CuGaO_2$ and $SrCu_2O_2$. The choice of material used can depend on the location of the contacts as well as the desired electrical characteristics such as transparency, junction resistivity and sheet resistance.

It is understood that other LED structures and geometries can be provided for use in the present invention with the structures having contacts accessible from one surface. These alternative embodiments can provide this access by utilizing other conductive structures such as conductive vias, traces or other conductive paths.

In the embodiment shown, the first contact 22a covers substantially the entire p-type layer 16, and the second contact covers a portion of the n-type layer 14. Since light is emitted from the LED primarily through the substrate 12, the first and second contacts 22a, 22b do not interfere with or reduce light emission. In other embodiments, the first and second contacts 22a, 22b can cover less than or more of their respective surfaces and other layers or structures can be included to assist in current spreading across their surfaces. In one possible embodiment, a thin current spreading layer can cover some or all of the p-type layer 16 and n-type layer 14, which can be transparent or semitransparent. Examples of these materials include platinum (Pt) or a transparent conductive oxide such as indium tin oxide (ITO), although other materials can also be used. The first and second contacts 22a, 22b can have varying thicknesses. In a preferred embodiment, the electrodes/contacts 22a, 22b are substantially thick and comprised of metal, and provide the primary mechanical support for the LED chips 10 when/if the substrate 12 is thinned or removed and when/if the GaN surface is further fabricated such as by etching.

Current spreading structures (not shown) can also be included on the surfaces of the p-type or n-type mesa to improve current spreading and injection from their contacts. The current spreading structures can have many different forms, but preferably comprises fingers of conductive material on the surface of the LED contacting one of the contacts 22a, 22b. The current spreading structures can be deposited using known methods and can comprise the materials described above such as Au, Cu, Ni, In, Al, Ag or combinations thereof and conducting oxides and transparent conducting oxides. According to one other possible embodiment, a filler material 24 may also be provided to electrically isolate first and second contacts 22a, 22b.

FIG. 2 depicts a capping wafer or layer 26 ("capping wafer") with a desired refractive index, which will be bonded to the LED wafer of LED chips 10. In some embodiments, the capping wafer 26 comprises a transparent and robust layer 28, and a phosphor coating or layer 30. In some embodiments, the transparent layer 28 is substantially transparent to the light emitted by the LED chips 10, the light from the phosphor coating 30, or both. It understood, however, that the transparent layer need not be 100% transparent to light from the LED chip 10 and phosphor coating 30. The capping wafer 26 can have a diameter that is substantially similar to or larger than that of the LED wafer, but it is understood that the capping wafer can be smaller than the diameter of the LED wafer and can take many different shapes and sizes. Ideally, the capping wafer 26 is pre-formed, and is bonded to the LED chips 10 at the wafer level to provide needed mechanical support during the latter stages of device fabrication and when handling the completed devices after they are singulated. As such, the capping wafer 26 can decrease the chances of mechanical damage to the LED chips 10 through fabrication, and increases the potential yield of wire-bond free chips. This can reduce the overall cost of fabricating LED chips. Moreover, the transparent layer 28 can have a CTE that more closely matches the CTE of the LED wafer. The CTE for the transparent layer 28 can fall into many different ranges. For example, in some embodiments the capping wafer 26 may have a CTE in the range of 2-25 ppm/° C., and in another embodiment it can have a CTE in the range of 2-14 ppm/° C. In still other embodiments it can have a CTE in the range of 13-20, 5-11, 7-9 or 2-5 ppm/° C., and in some embodiments it can have a CTE of approximately 7.4 ppm/° C.

In some embodiments, the transparent layer 28 can comprise a material with a CTE that matches that of the package (or submount shown for example as element 36 in FIG. 4) that the LED is being mounted to. This reduces the stress that is experienced with the layers of the LED chip during the attachment thermal cycle, there reducing the likelihood that the chip will experience damage during this cycle. These transparent layers can have the same ranges of CTE as those described above, including a CTE in the range of 2-14 ppm/° C. in one embodiment, and in another embodiment a CTE in the range of 5-11 ppm/° C. In still other embodiments the can have a CTE in the range of 7-9 ppm/° C.

In some embodiments, the submount can comprise alumina, which has a CTE of approximately 8 ppm/° C., while in other embodiments the submount can comprise aluminum nitride (AlN), which has a CTE of approximately 5 ppm/° C. Both of these have an acceptable CTE match for certain semiconductor materials, such as GaN which has a CTE in the lateral direction of 5.6 ppm/° C. For each of these submounts a capping wafer should have a transparent layer 28 with a CTE that substantially matches the CTE of the submount. In one embodiment, the CTE difference should be less that 20%, and in other embodiments the CTE difference should be less than 30%. In still other embodiments, the CTE difference should be less than 40%. In one embodiment the capping wafer 26 can comprise a glass transparent layer 28 and a silicone coating 30. Many different types can be used with one embodiment of the transparent layer 28 comprising commercially available glass such as Corning 0211 Borosilicate Glass, which can have a CTE of 7.4 ppm/° C. In other embodiments, the layer 28 can comprise other materials, such as sapphire, which has a CTE of 7-7.7 ppm/° C. depending partially on its crystal orientation. It is understood that many other materials with different CTEs can also be used.

In other embodiments, the submount can comprise other materials with different CTEs. In some embodiments, the submount can comprise lower CTE materials such as silicon, which has a CTE of approximately 2.5 ppm/° C. In these embodiments the transparent layer 28 capping wafer 26 can have a CTE in the range of 2-14 or 2-5 ppm/° C., while in other embodiments it can have a CTE in the range of 2.5-3.5 ppm/° C. In one embodiment, the transparent layer 28 can comprise low thermal expansion borosilicate glass that can have a CTE of approximately 3.25 ppm/° C., but it is understood that many other materials with different CTEs can also be used.

In still other embodiments, the submount can comprise a metal, such as Cu, having a higher CTE of 16.4 ppm/° C. In some of these metal embodiments, the capping transparent layer 28 can have a CTE in the range of 10-25 ppm/° C., while in other embodiments the transparent layer can have a CTE in the range of 13-20 ppm/° C. In still other embodiments, the transparent layer can have a CTE in the range of 15-17 ppm/° C. In some embodiments, specialty glasses can be used for the transparent layer 28 having a CTE that is engineered. One such specialty glass includes commercially available Advanced Ceramics Mexim C ACL 2091, which can have an CTE of approximately 16.5 ppm/° C. It is understood that many other materials with different CTEs can also be used.

In some embodiments, the coating 30 may preferably comprise a phosphor-loaded silicone, with the phosphor acting as a down-converter for white-emitting light sources. It is understood that colors other than white may be desired, or that the LED chip can have its own conversion material to convert light emitted from the LED chip. In these embodiments a down-converter may not be necessary in the capping wafer and the capping wafer acts mainly as a robust mechanical support. However, by incorporating the down-converter as an element of the pre-formed capping wafer 26 for white-emitting light sources, the overall fabrication process can be simplified.

The silicone in the coating 30 can serve as and adhesive between the capping wafer 26 and the LED chips 10. It is understood however, that other embodiments can be provided without the coating 30. In these embodiments, the transparent layer 28 can be bonded directly to the LED chips 10 using different processes such as heat or pressure to achieve bonding. In these embodiments, the transparent layer can be included with our without a conversion material or phosphor, and in these direct bonded embodiments a conversion material can be included on other surfaces of the transparent layer 28.

While one embodiment of the capping wafer 26 may preferably be formed of glass with a silicone/phosphor coating, it is understood that other materials are suitable according to the present invention can be used for both. Beyond the materials described above, the capping wafer 26 may also comprise a single crystal phosphor sheet, sintered phosphors, or a glass sheet filled with phosphor particles. Moreover, the transparent portion of the capping wafer may alternatively comprise any other suitable materials that can be mechanically robust and capable of withstanding typical die attach processes at high temperatures, with other possible materials including SiC, GaN or ZnO.

The coating 30 can also comprise many different materials beyond silicone, with the different materials preferably being robust after curing and substantially transparent in the visible wavelength spectrum. Suitable alternative materials silicones, epoxies, spin-on glass, BCB, polymides and polymers, with the preferred material being silicone because of its high transparency and reliability in high power LEDs. A suitable silicone is commercially available from Dow® Chemical under silicone product number 0E6665. In other embodiments, the coating material can be engineered to be index matched with the features such as the chip (semiconductor material) and growth substrate, which can reduce total internal reflection (TIR) and improve light extraction.

Many different phosphors can be used in the coating 30 according to the present invention. In one embodiment according to the present invention LEDs can emit light in the blue wavelength spectrum and the phosphor absorbs some of the blue light and re-emits yellow. The LED can then emit a white light combination of blue and yellow light. In one embodiment the phosphor comprises commercially available YAG:Ce, although a full range of broad yellow spectral emission is possible using conversion particles made of phosphors based on the $(Gd,Y)_3(Al,Ga)_5O_{12}$:Ce system. The following lists some additional suitable phosphors used as conversion particles in LED chips, although others can be used. Each exhibits excitation in the blue and/or UV emission spectrum, provides a desirable peak emission, has efficient light conversion, and has acceptable Stokes shift:

Yellow/Green
$(Sr,Ca,Ba)(Al,Ga)_2S_4:Eu^{2+}$
$Ba_2(Mg, Zn)Si_2O_7:Eu^{2+}$
$Gd_{0.46}Sr_{0.31}Al_{1.23}O_xF_{1.38}:Eu^{2+}{}_{0.06}$
$(Ba_{1-x-y}Sr_xCa_y)SiO_4:Eu$
$Ba_2SiO_4:Eu^{2+}$
Red
$Lu_2O_3:Eu^{3+}$
$(Sr_{2-x}La_x)(Ce_{1-x}Eu_x)O_4$
$Sr_2Ce_{1-x}Eu_xO_4$
$Sr_{2-x}Eu_xCeO_4$
$SrTiO_3:Pr^{3+}, Ga^{3+}$
$CaAlSiN_3:Eu^{2+}$
$Sr_2Si_5N_8:Eu^{2+}$ Different sized phosphor particles can be used including but not limited to nanometer-sized particles to 20-30 micron sized particles, or larger. Smaller particle sizes typically scatter and mix colors better than larger sized particles to provide a more uniform light. Larger particles are typically more efficient at converting light compared to smaller particles, but emit a less uniform light. In one embodiment, the particle sizes are in the range of 2-5 microns. In other embodiments, the coating 30 can comprise different types of phosphors or can comprise multiple phosphor coatings for monochromatic or polychromatic light sources. The coating 30 can also have different concentrations of phosphor materials, with a typical concentration being in range of 30-70% by weight. In one embodiment, the phosphor concentration is approximately 65% by weight, and is preferably uniformly dispersed throughout the binder. Still in other embodiments the coating can comprise multiple layers of different concentrations of types of phosphors, or a first coat of clear silicone can be deposited followed by phosphor loaded layers. The coating can also include elements to scatter or mix the light, including but not limited to scattering particles. Furthermore, the surface of the coating 30 and or the transparent layer can be roughened or shaped to enhance light extraction.

At least one advantage of pre-forming the capping wafer 26 is the ability to prescreen and/or tailor the down-converter to closely match the LED wafer and the desired color point. With regard to the phosphor coating, the coating may be grinded to a desired thickness at the wafer level. Additionally, the thickness of the conversion material can be individually tailored at each LED at the wafer level, which can occur either before or after the capping wafer and the LED wafer are bonded together. Moreover, the capping wafer is advantageous because it may make any additional packaging unnecessary. As such, a finished die with the capping wafer may serve as a final chip scale package. This can reduce the overall cost and footprint for lighting applications.

The thickness of the capping wafer 26 can range, for example, from anywhere between 50-5000 μm, with a preferred range of 100-1000 μm. The capping wafer may initially be substantially thicker prior to bonding it to the LED wafer, and then later be grinded down or polished to a desired final thickness prior to device singulation. For example, the transparent layer 28a of wafer 26 in FIG. 5 is either ground down or polished (as seen in comparison with the wafer of FIG. 4) prior to device singulation. Thicker wafers may be preferred during fabrication, as they aid in the mechanical robustness of the device and prevent bowing effects during fabrication, which can be particularly problematic in larger diameter wafers. Also, light is capable of escaping from the sidewalls of the capping wafer 26, which is advantageous at least in that it allows for thicker wafers. This may allow for better efficiency in applications where the wire-bond free chips are not subject to additional packaging.

FIG. 3 shows capping wafer 26 bonded to LED chips 10 using an adhesive layer 38. Preferably, a thin, transparent adhesive layer 38 with a desired refractive index is used, with one possible suitable material being silicone. However, it is understood that other suitable materials may also be used, with materials preferably being robust after curing and substantially transparent in the visible wavelength spectrum. Suitable materials include many of those used in the coating 30, including but not limited to silicones, epoxies, glass, inorganic glass, spin-on glass, dielectrics, BCB, polymides, polymers and hybrids thereof, with the preferred material being silicone because of its high transparency and reliability in high power LEDs. Suitable phenyl- and methyl-based silicones are commercially available from Dow® Chemical. In other embodiments, the binder material can be engineered to be index matched with the features such as the chip (semiconductor material) and growth substrate, which can reduce total internal reflection (TIR) and improve light extraction.

The capping wafer 26 helps to minimize the thermal stress inflicted on the LED wafer while the two wafers are bonded together. After the capping wafer 26 and LED chips 10 are bonded, final fabrication steps such as mesa etch, planarization, and/or metallization can be applied to the unbounded surface of the LED chips 10 opposite the capping wafer 26. In this way, the capping wafer 26 may act as a robust mechanical support for the LED chips 10, thus limiting any potential damage to the otherwise delicate chips that may occur during fabrication.

In some embodiments, the capping wafer 26 and LED chips 10 bonded together as shown in FIG. 3 comprises the completed wafer level processing, with the phantom lines showing the separation or singulation lines between the primary finished product. To make the finished LED chips of FIG. 3 into usable LED components, the LED chips can be flip-chip mounted (i.e. wire bonded) onto conventional packages or submounts (or printed circuit boards). By mounting a capping wafer to the LED chips prior to singulation, and by choosing a transparent layer material with a CTE as described above to match the package/submount, the LED chips can be reliably flip-chip mounted with little or no damage to the LED chips. Accordingly, the capping wafer can increase the yield of LED chips that are singulated and flip-chip mounted according to the present invention. In other embodiments, the LED chips wafer can be flip-chip mounted to the package/submount, but this can have result in end devices having a submount that is the same size as the LED and adds an additional attach step.

Figure 6:
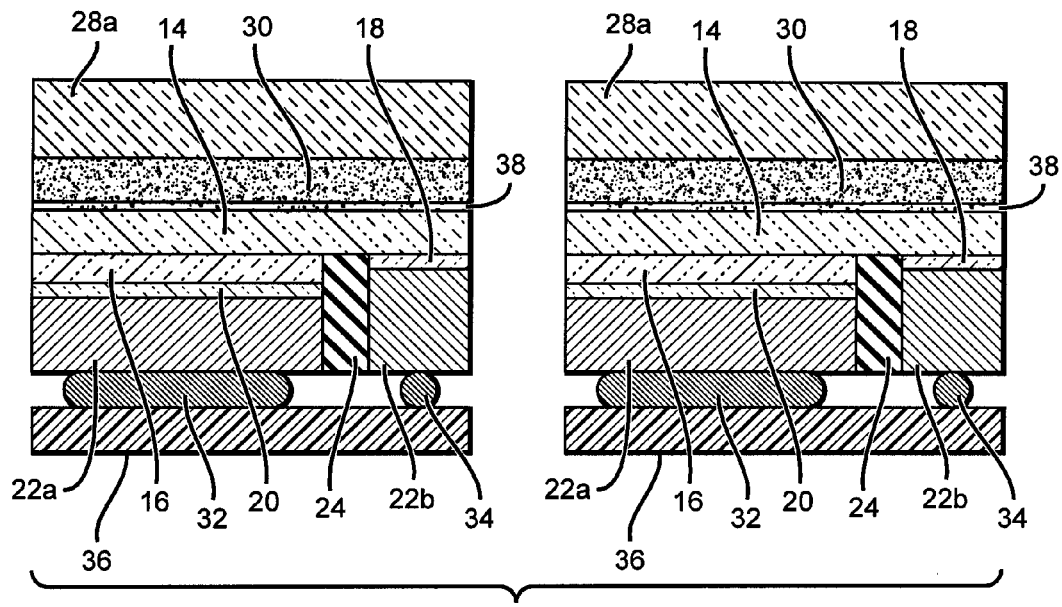
FIG. 6 is a sectional view of the capping wafer, submount wafer and LED wafer in FIG. 5 following singulation.

When fabrication of the LED chips 10 is complete, each LED chip may comprise portions of submount wafer 36, with the LEDs flip-chip mounted to it. The submount wafer 36 in FIGS. 4-5, like the LEDs above, is shown at a wafer level of the fabrication process. As described above, phantom lines are included to show separation or the dicing line at the submount wafer 36 for the individual LED chips 10. When fabrication is complete and the LED chips 10 are singulated, each of the LED chips will have a portion of the submount wafer 36 as shown in FIG. 6. For example, the submount wafer 36 can be sized for fabricating LED chips having a 1 millimeter (mm) square size, and can provide submount portions for up to 4500 LED chips.

The submount wafer 36 can be made of many different materials such as those described above and can include conducting or semiconducting materials or insulating materials. Some suitable materials include ceramics such as alumina, aluminum oxide, aluminum nitride or polymide. In other embodiments the submount wafer can comprise a printed circuit board (PCB), sapphire or silicon, silicon carbide, or any other suitable material, such as commercially available T-Clad thermal clad insulated substrate material.

A dielectric layer (not shown) may be included on the surface of the submount wafer 36. The dielectric layer electrically insulates the wafer 36 such that electrical signals on the surfaces of the submount wafer 36 do not spread into the submount wafer 36. This prevents the signals being applied to n- and p-type contacts 22a, 22b from shorting through the submount wafer 36. Different materials can be used for the dielectric layer, with suitable materials being silicon nitride or silicon oxide. For submount wafers made of an insulating material such as ceramic, it may not be necessary to include a dielectric layer for electrical isolation.

Referring now to FIG. 4, the LEDs in wafer form are flip-chip mounted to the submount wafer 36. Flip-chip mounting is generally known in the art and only briefly discussed herein. The LEDs are mounted to the submount wafer 36 by a layer of conductive bond material 32, 34, which is typically one or more bond/metal layers such as solder. The bond material 32, 34 may also be made of a material that reflects light. This reflective property can improve the emission efficiency of an LED chip. In other embodiments, reflectors can be included in many different locations to provide the desired reflective properties. It is understood that the submount wafer 36 can be made of many different materials, such as those described above in the discussion of CTE for desired materials.

Referring now to FIG. 6, the individual LED chips 10 can be singulated using known methods such as dicing, scribe, breaking, cleaving or etching. This generally comprises cutting through the capping wafer 26 and the submount wafer 36 between LEDs either from the bottom through the submount wafer first or the top through the capping wafer 26 first. The singulating process separates each of the LED chips 10 with each having substantially the same thickness of capping wafer 26, and as a result, substantially the same amount of mechanical support as well as phosphor and emission characteristics. This allows for reliable and consistent fabrication of LED chips 10 having similar characteristics.

Following singulating, the LED chips 10 can be mounted in a package, or to a submount or printed circuit board (PCB) without the need for further processing to add phosphor. A conventional encapsulation can then surround the LED chip. In another embodiment, the LED chip can be enclosed by a hermetically sealed cover with an inert atmosphere surrounding the LED chip at or below atmospheric pressure.

The LED chip 10 can be surface mounted in a package without the use of wire bonds to apply an electrical signal. In particular, there is no wire bond to the top surface of LED chip for applying an electrical signal, which leaves an unobstructed top surface. Accordingly, a package utilizing the LED chip 10 can have secondary optics directly mounted on the top surface without the need for compensating for wire bonds or other structures. This can simplify fabrication of the LED package by not having an intermediate layer between to cover the wire bonds before mounting the secondary optics or by not having other features such as reflective cups that allow for the secondary optics to be mounted above the LED chip with a space for the wire bonds.

It is understood that in other embodiments, the LED chips' 10 growth substrate can be removed after (or before) flip-chip bonding, with the substrate removed using known grinding and/or etching processes. In other embodiments, the growth substrate or at least portions thereof remain. The growth substrate or the remaining portions can be shaped or textured to enhance light extraction from the LEDs.

Figure 11:
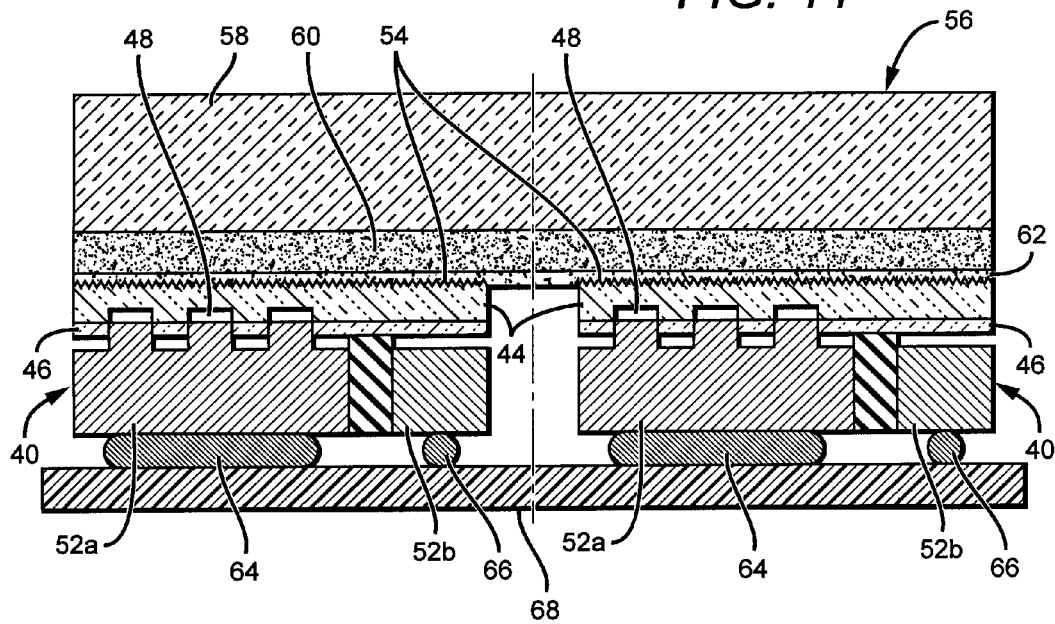
FIG. 11 is a sectional view of a submount wafer and LED wafer in FIG. 10 following flip-chip mounting.

FIGS. 7-12 show another possible embodiment of wafer level LED chips 40 with the series of figures showing the LED chips 40 at fabrication steps. The LED chips comprise LEDs, and as above, for ease of description and understanding the LEDs are shown as separate devices. Vertical phantom lines (as shown in FIGS. 10-11) are included to show separation or the dicing line between the LED chips 40 at a later fabrication step. Moreover, while FIGS. 7-12 show only two devices at the wafer level, it is understood that many more LED chips can be formed from a single wafer.

The layers of the LEDs generally comprise an active layer/region sandwiched between first and second oppositely doped epitaxial layers 44, 46, all of which are formed successively on a substrate 42. As described above, it is understood that additional layers and elements can also be included in the LEDs. In one embodiment, the first epitaxial layer 44 is an n-type doped layer and the second epitaxial layer 46 is a p-type doped layer, although in other embodiments the first layer 44 can be p-type doped and the second layer 46 can be n-type doped. The first and second epitaxial layers 44, 46 are hereinafter referred to as n-type and p-type layers, respectively.

Figure 7:
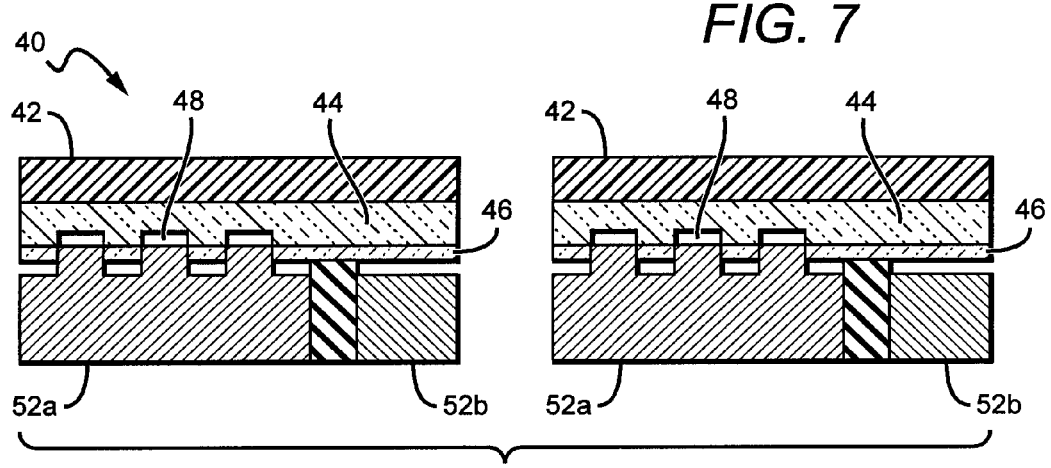
FIG. 7 is a sectional view of another embodiment of an LED wafer at a fabrication step in one method according to the present invention.

The substrate 42, active region and layers 44, 46 of the LEDs may be fabricated from different material systems as described above. Additionally, as described above with substrate 12, substrate 42 can have different thicknesses. In an optional processing step, the substrate 42 can also be thinned or removed using known methods such as mechanical grinding, etching, or laser-ablation to allow for easier and more reliable singulating of the LED chips. This thinning or substrate removal can also result in LED chips having the desired thickness. Note that the substrate 42 depicted in FIG. 7 is no longer depicted in FIGS. 8-12, as it has been removed according to one possible embodiment. It is understood that the substrate may alternatively be thinned or untouched. In still other embodiments where the substrate 42 is made of a material that is compatible with shaping, such as sapphire, the substrate 42 can include different shapes to enhance light extraction.

This particular embodiment is adapted for use with LEDs arranged so both contacts are accessible from one surface, such as with lateral geometry LEDs as shown. However, it is understood that vertical geometry LEDs may also be used. Each of the LEDs can have first and second electrodes or contacts 52a, 52b. In the embodiment shown, the first contact 52a is in contact with the p-type layer 46, and the second contact 52b is in contact with the n-type layer contact 44 by way of vias 48. An electrical signal applied to the first contact 52a spreads into the p-type layer 46 and a signal applied to the second contact 52b spreads into the n-type layer 44.

It is understood that other LED structures and geometries can be provided for use in the present invention with the structures having contacts accessible from one surface. These alternative embodiments can provide this access by utilizing other conductive structures such as conductive vias, traces or other conductive paths.

As described above, the first and second contacts 52a, 52b can cover less than or more of their respective surfaces and other layers or structures can be included to assist in current spreading across their surfaces. Moreover, the first and second contacts 52a, 52b can have varying thicknesses. In a preferred embodiment, the electrodes/contacts 52a, 52b are substantially thick and comprised of metal, and provide the primary mechanical support for the LED chips 40 when/if the substrate 42 is thinned or removed and when/if the GaN surface is further fabricated such as by etching.

FIG. 9 depicts a capping wafer 56 with a transparent layer 58 and a layer 60 comprising a down-converter, with wafer similar to capping wafer 26 described in detail above. As shown in FIG. 10, the capping wafer 56 is bonded to the LED wafer of LED chips 40 (as shown in FIGS. 7 and 8) using an adhesive 62 similar to adhesive 38 described above. After the capping wafer 56 and LED chips 40 are bonded, final fabrication steps such as mesa etch, planarization, and/or metallization can be applied to the unbounded surface of the LED chips 40 opposite the capping wafer 56.

When fabrication of the LED chips 40 is complete, each LED chip may comprise portions of submount wafer 68 (similar to wafer 36 above), with the LEDs flip-chip mounted to it. The submount wafer 68 in FIGS. 11-12, like submount wafer 36 shown in FIGS. 4-6 and described above, is shown at a wafer level of the fabrication process. As described above, phantom lines are included to show separation or the dicing line at the submount wafer 68 for the individual LED chips 40. When fabrication is complete and the LED chips 40 are singulated, each of the LED chips will have a portion of the submount wafer 68 as shown in FIG. 12.

Referring now to FIG. 11, the LEDs in wafer form are flip-chip mounted to the submount wafer 68. The LEDs are mounted to the submount wafer 68 by a layer of conductive bond material 64, 66, which is typically one or more bond/metal layers such as solder.

Figure 12:
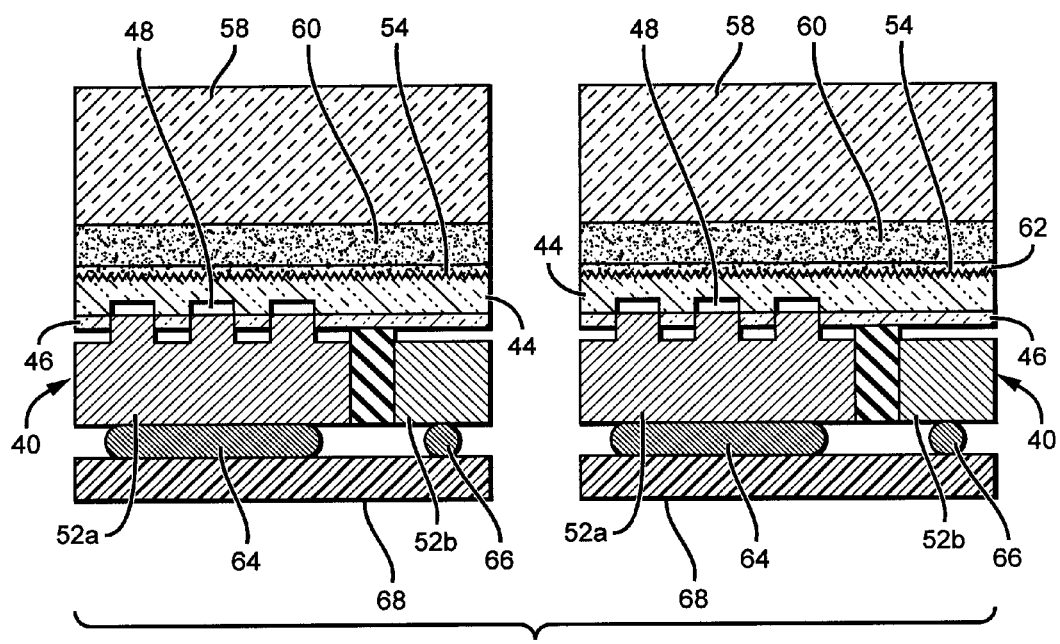
FIG. 12 is a sectional view of the capping wafer, submount wafer and LED wafer in FIG. 11 following singulation.

Referring now to FIG. 12, the individual LED chips 40 can be singulated using known methods as described above. Following singulating, the LED chips 40 can be mounted in a package, or to a submount or printed circuit board (PCB) without the need for further processing to add phosphor. A conventional encapsulation can then surround the LED chip. The LED chip 40 can be surface mounted in a package without the use of wire bonds to apply an electrical signal.

Referring now to FIGS. 7-8, the LED chips' 40 growth substrate 42 can be partially or totally removed, with portions of or the entire substrate removed using known grinding and/or etching processes. Additionally, portions of the n-type layer 44 (or various layers according to other contemplated embodiments) can be shaped or textured as shown at top surface 54 to enhance light extraction from the LEDs.

The LED chips have been described above as being adapted for mounting in packages utilizing a single LED chip. It is understood, however, that the LED chips according to the present invention can be arranged in arrays of LED chips, with the array having LED chips that are structurally the same or similar and emit light at the same or similar wavelengths of light. Alternatively, the LED chips can be structurally different or can emit different wavelengths of light. In some embodiments, the LED chips can be electrically interconnected so that they emit light in response to one electrical signal that is conducted to all the LEDs chips in the array. In other embodiments emission the LEDs chips can be individually controlled by respective signals to control the emission intensity of each of the LED chips. This in turn can control the emission intensity of the LED array, and in arrays having LED chips emitting different colors of light, this can control the intensity and emission color of the overall array.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A method for fabricating light emitting diode (LED) chips, comprising:
   pre-forming a capping wafer, said capping wafer comprising a conversion material;
   fabricating a wire-bond free LED wafer comprising a plurality of LEDs;
   bonding said capping wafer to said LED wafer using an adhesive such that said conversion material is adjacent said LED wafer, said capping wafer having a coefficient of thermal expansion in the range of 2-25 ppm/° C.; and
   singulating said LED chips upon the completion of all final fabrication steps.

2. The method of claim 1, wherein said capping wafer keeps said adhesive flat during curing, and further minimizes thermal stress on said LEDs.

3. The method of claim 1, wherein said capping wafer acts as a robust mechanical support for said LED chips.

4. The method of claim 1, wherein said capping wafer may be grinded down or polished prior to said singulation.

5. The method of claim 1, wherein said final fabrication steps comprise one or more of mesa etch, planarization, or metallization.

6. The method of claim 1, wherein said LEDs have a lateral geometry and comprise n- and p-type layers, and further comprise first and second contacts on said n- and p-type layers respectively.

7. The method of claim 1, wherein said capping wafer comprises multiple layers with different compositions.

8. The method of claim 1, further comprising mounting one of said LED chips to a second submount or printed circuit board (PCB).

9. The method of claim 1, further comprising flip-chip mounting said LED wafer on a surface of a submount wafer prior to said singulating.

10. The method of claim 9, wherein at least some of said singulated LED chips comprise an LED, a portion of said capping wafer, and a portion of said submount wafer.

11. The method of claim 1, wherein said capping wafer comprises a transparent layer and a coating comprising said conversion material.

12. The method of claim 11, wherein said transparent layer has a coefficient of thermal expansion (CTE) that substantially matches the CTE of said LED wafer.

13. The method of claim 11, further comprising mounting said LED chips to a submount, wherein said capping wafer comprises a transparent layer and a coating comprising said conversion material, wherein said transparent layer has a coefficient of thermal expansion (CTE) that substantially matches the CTE of said submount.

14. The method of claim 11, wherein said conversion material comprises one or more of a silicone layer with dispersed phosphor particles, a single crystal phosphor sheet, sintered phosphors, or a glass sheet filled with phosphor particles.

15. The method of claim 1, wherein said adhesive is substantially transparent and applied in a thin layer.

16. The method of claim 15, wherein said adhesive comprises silicone.

17. The method of claim 1, wherein said LED chips emit white light.

18. The method of claim 17, wherein one or more of said n- or p-type layers is shaped or textured.

19. The method of claim 1, wherein said LEDs are provided on a growth substrate.

20. The method of claim 19, further comprising removing at least a portion of said growth substrate prior to bonding said capping wafer.

21. The method of claim 19, wherein said substrate is shaped or textured.

22. A light emitting diode (LED) chip wafer, comprising:
   a submount wafer;
   a plurality of LEDs flip-chip mounted on said submount wafer; and
   a capping wafer bonded to said LED chip wafer using an adhesive, said capping wafer comprising a conversion material, wherein said conversion material is adjacent said LED chip wafer, said capping wafer further comprising a material acting as a robust mechanical support for said LEDs, said capping wafer having a coefficient of thermal expansion in the range of 2-25 ppm/° C.;
   wherein at least some of the light emitted from said LEDs passes through said capping wafer where at least some of said light is converted by said conversion material;
   wherein said LEDs are capable of being singulated.

23. The LED chip wafer of claim 22, wherein the coefficient of thermal expansion for said robust mechanical support material is substantially the same as the CTE for the material comprising the LEDs in said LED chip wafer.

24. The LED chip wafer of claim 22, wherein the coefficient of thermal expansion for said robust mechanical support material is substantially the same as the CTE of the material comprising said submount wafer.

25. The LED chip wafer of claim 22, wherein there is less than a 40% difference in the coefficient of thermal expansion for said robust mechanical support material compared to the CTE of the material comprising the LEDs in said LED chip wafer.

26. The LED chip wafer of claim 22, wherein there is less than a 40% difference in the coefficient of thermal expansion for said robust mechanical support material compared to the CTE of the material comprising the submount wafer.

27. The LED chip wafer of claim 22, wherein there is less than a 30% difference in the coefficient of thermal expansion for said robust mechanical support material compared to the CTE of the material comprising the LEDs in said LED chip wafer.

28. The LED chip wafer of claim 22, wherein there is less than a 30% difference in the coefficient of thermal expansion for said robust mechanical support material compared to the CTE of the material comprising the submount wafer.

29. The LED chip wafer of claim 22, wherein at least some of said LEDs have lateral geometry.

30. The LED chip wafer of claim 22, wherein said submount wafer is capable of being separated into LED chips.

31. The LED chip wafer of claim 22, wherein said capping wafer has a uniform thickness above said LEDs.

32. The LED chip wafer of claim 22, wherein said LEDs are made of materials from the Group-III nitride material system.

33. The LED chip wafer of claim 22, wherein said LEDs are interconnected in an LED array.

34. The LED chip wafer of claim 22, capable of emitting white light from said LEDs and capping wafer.

35. The LED chip wafer of claim 22, wherein said adhesive is substantially transparent, applied in a thin layer, and comprises silicone.

36. The LED chip wafer of claim 22, wherein the thickness of the conversion material can be individually tailored at each LED at the wafer level either before or after said capping wafer and said LED wafer are bonded together.

37. The LED chip wafer of claim 36, wherein said conversion material comprises phosphor.

38. The LED chip wafer of claim 22, wherein said wherein said robust support material comprises a transparent material.

39. The LED chip wafer of claim 38, wherein said transparent material comprises one or more of glass, SiC, sapphire, GaN, or ZnO, and said conversion material comprises one or more of a silicone layer with dispersed phosphor particles, a single crystal phosphor sheet, sintered phosphors, or a glass sheet filled with phosphor particles.

40. A light emitting diode (LED) chip, comprising:
   a wire-bond free LED;
   a capping wafer bonded to said LED using an adhesive, said capping wafer serving as a mechanical support for said LED chip; and
   a conversion material integrated in said capping wafer, said conversion material adjacent said LED and converting at least some of the light emitted from said LED, said capping wafer having a coefficient of thermal expansion in the range of 2-25 ppm/° C.

41. The LED chip of claim 40, wherein said capping wafer is continuous over the top surface of said LED and has a substantially uniform thickness.

42. The LED chip of claim 40, emitting a white light combination of LED light and light from said conversion material.

43. The LED chip of claim 40, further comprising a submount, said LED flip-chip mounted on said submount.

44. The LED chip of claim 40, wherein said capping wafer comprises:
   a transparent portion; and
   a layer comprising said conversion material;
   wherein said transparent portion comprises one or more of glass, SiC, sapphire, GaN, or ZnO, and said conversion material comprises one or more of a silicone layer with dispersed phosphor particles, a single crystal phosphor sheet, sintered phosphors, or a glass sheet filled with phosphor particles.

45. The LED chip of claim 40, wherein said adhesive comprises silicone.

* * * * *

UNITED STATES PATENT AND TRADEMARK OFFICE
CERTIFICATE OF CORRECTION

PATENT NO. : 8,329,482 B2  
APPLICATION NO. : 12/771938  
DATED : December 11, 2012  
INVENTOR(S) : Yao et al.

Page 1 of 1

It is certified that error appears in the above-identified patent and that said Letters Patent is hereby corrected as shown below:

In the Claims:

(Claim 38) Page 18., Col. 17, Line 10, please remove one of the [wherein said]

Signed and Sealed this  
Twenty-sixth Day of February, 2013

Teresa Stanek Rea  
*Acting Director of the United States Patent and Trademark Office*